(12) United States Patent  
Carter

(10) Patent No.: US 6,486,737 B1
(45) Date of Patent: Nov. 26, 2002

(54) BIPOLAR RAIL-TO-RAIL INPUT STAGE WITH TRANSCONDUCTANCE CORRECTION

(75) Inventor: Nathan Carter, Arroyo Grande, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/994,213

(22) Filed: Nov. 26, 2001

(51) Int. Cl.[7] ................................................. H03F 3/45
(52) U.S. Cl. ..................... 330/257; 330/252; 330/258; 330/261; 330/311; 327/63; 327/560; 327/563
(58) Field of Search ............................... 330/252, 257, 330/258, 261, 311; 327/63, 560, 563

(56) References Cited

U.S. PATENT DOCUMENTS

| | | | | |
|---|---|---|---|---|
| 5,392,003 A | * | 2/1995 | Nag et al. | 330/254 |
| 5,455,535 A | * | 10/1995 | Sauer | 327/560 |
| 5,714,906 A | * | 2/1998 | Motamed et al. | 327/563 |
| 5,729,177 A | * | 3/1998 | Goutti | 330/257 |
| 5,789,949 A | * | 8/1998 | Giordano et al. | 327/63 |
| 6,281,753 B1 | * | 8/2001 | Corsi et al. | 330/258 |

* cited by examiner

Primary Examiner—Michael Tokar
Assistant Examiner—Linh Van Nguyen
(74) Attorney, Agent, or Firm—Koppel, Jacobs, Patrick & Heybl

(57) ABSTRACT

A bipolar rail-to-rail input stage with emitter degeneration includes a current reduction circuit arranged to reduce the amount of current which the PNP and NPN input pairs would otherwise conduct when the common mode input voltage is such that both pairs are conducting. The current reduction circuit is preferably arranged such that the transconductance ($G_{m2}$) of the input stage when both pairs are conducting is equal to its transconductance ($G_m$) when only one pair is active. The current reduction circuit preferably comprises a current shunt circuit made from four bipolar transistors: a pair of PNP transistors, the emitters of which are connected to respective emitters of the PNP input transistors, and a pair of NPN transistors, the emitters of which are connected to respective emitters of the NPN input transistors, with the bases and collectors of all four shunt transistors connected together at a summing node. When the shunt transistors are properly sized with respect to the input devices, $G_m$ is made equal to $G_{m2}$.

11 Claims, 9 Drawing Sheets

Harmonic Distortion w/ and w/o transconductance correction
G=1, Supply = 3V, 2Vpp

| f | w/ | Harmonic | w/o | Harmonic |
|---|---|---|---|---|
| 1k | −101dBc | | −99.2dBc | 2nd |
| 10k | −101dBc | | −98.0dBc | 2nd |
| 100k | −96dBc | | −88.1dBc | 5th |
| 200k | −88dBc | | −76.0dBc | 4th |
| 500k | −80.6dBc | | −68.0dBc | 5th |
| 1M | −73.6dBc | | −61.7dBc | 5th |
| 2M | −60.3dBc | 3rd | −54.6dBc | 5th |
| 3M | −51dBc | 3rd | −49.7dBc | 3rd |

FIG.4b

BIPOLAR RAIL-TO-RAIL INPUT STAGE WITH TRANSCONDUCTANCE CORRECTION

BACKGROUND OF THE INVENTION

1. Field of the Invention

This invention relates to the field of rail-to-rail amplifiers, and particularly to methods of reducing gain error in the input stage of a rail-to-rail amplifier.

2. Description of the Related Art

A rail-to-rail amplifier's input stage typically includes complementary differential pairs. One differential pair conducts when the common mode voltage $V_{cm}$ applied to the amplifier's inputs is above a particular reference voltage $V_{ref}$, and the other pair conducts when $V_{cm}$ is less than $V_{ref}$.

To improve slew rate and linear input range, the input stage transistors of a bipolar rail-to-rail amplifier often include emitter degeneration resistors. When so arranged, the transconductance $G_m$ of the input stage when only one of the differential pairs is conducting is given by:

$$G_m = \frac{1}{\frac{(kT/q)}{I_T/2} + R_d}$$

where $kT/q$ is a constant for a bipolar transistor, $I_T$ is the differential pair's tail current, and $R_d$ is the resistance of the emitter degeneration resistors.

As the common mode voltage moves above and below $V_{ref}$, the active differential pair transitions from one pair to the other. When $V_{cm}=V_{ref}$, both pairs are active, with each pair getting one-half of the total tail current $I_T$. Under this condition, the transconductance $G_{m2}$ of the input stage is given by:

$$G_{m2} = \frac{2}{\frac{(kT/q)}{I_T/4} + R_d}$$

By inspection, it is seen that a bipolar rail-to-rail input amplifier with degeneration has a higher gain in the transition region, i.e., with both pairs active, than it does when one pair is operating alone. In fact, when the amplifier is heavily degenerated, i.e., with $$R_d \gg \frac{kT/q}{I_T/2},$$

$G_{m2} \approx 2G_m$. This results in a gain error when operating in the transition region, which can cause discontinuities and distortion in the output voltage produced by the input stage.

SUMMARY OF THE INVENTION

A bipolar rail-to-rail input stage is presented which overcomes the problem noted above. Gain error which would otherwise arise is reduced by lowering the transconductance of the input stage transistors when operating in the transition region.

The degeneration resistors connected in the emitter circuits of the PNP transistors are connected together at a first common mode node, and the NPN transistors' emitter resistors are connected together at a second common mode node. The transconductance of the input stage is reduced in the transition region with a current reduction circuit, which is arranged to sense the difference in voltage between the two common mode nodes, and to reduce the amount of current which the input pairs would otherwise conduct when $V_{cm} \approx V_{ref}$. The current reduction circuit is preferably arranged so that the transconductance of the input stage when $V_{cm}=V_{ref}$ is made equal to the transconductance of the input stage when $V_{cm}>V_{ref}$ or $V_{cm}<V_{ref}$ and only one pair is conducting.

The current reduction circuit preferably comprises a current shunt circuit made from four bipolar transistors: a pair of PNP transistors, the emitters of which are connected to respective emitters of the PNP input transistors, and a pair of NPN transistors, the emitters of which are connected to respective emitters of the NPN input transistors, with the bases and collectors of all four shunt transistors connected together at a summing node. A current shunt circuit so arranged senses the difference in voltage between the common mode nodes and shunts current around the input pairs to reduce the current they would otherwise conduct and thereby lower their respective transconductances when $V_{cm} \approx V_{ref}$. When the shunt transistors are properly sized with respect to the input devices, $G_m$ is made equal to $G_{m2}$.

Further features and advantages of the invention will be apparent to those skilled in the art from the following detailed description, taken together with the accompanying drawings.

BRIEF DESCRIPTION OF THE DRAWINGS

FIG. 4b is a table listing harmonic distortion values at various frequencies for an operational amplifier employing a rail-to-rail input stage operating in the transition region with and without transconductance correction per the present invention.

DETAILED DESCRIPTION OF THE INVENTION

Figure 1:
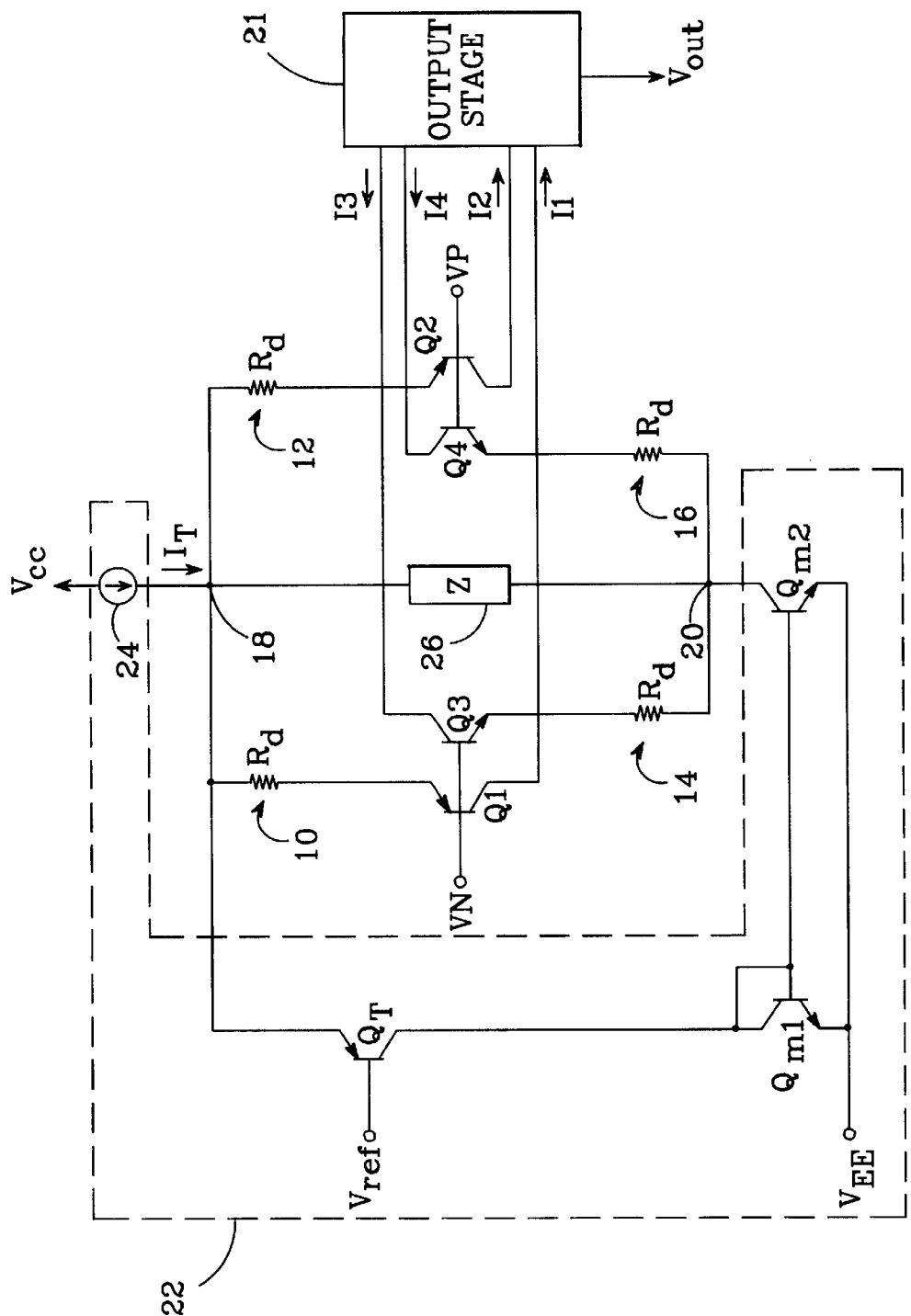
FIG. 1 is a schematic diagram of a rail-to-rail input stage per the present invention.

A bipolar rail-to-rail input stage which overcomes the gain error problem described above is shown in FIG. 1. The present input stage comprises two differential pairs: a pair of PNP transistors Q1 and Q2, and a pair of NPN transistors Q3 and Q4. The bases of Q1 and Q3 are connected to receive one side (VN) of a differential input signal, and the bases of Q2 and Q4 are connected to receive the other side (VP) of the differential input signal. To improve slew rate and linear input range, each of Q1, Q2, Q3 and Q4 has a respective degeneration resistor 10, 12, 14 and 16 connected in its emitter circuit; each degeneration resistor has a resistance value $R_d$. The terminals of resistors 10 and 12 opposite Q1 and Q2 are connected to a common mode node 18, and the terminals of resistors 14 and 16 opposite Q3 and Q4 are connected to a common mode node 20.

Input stage transistors Q1, Q2, Q3 and Q4 conduct currents I1, I2, I3 and I4, respectively, in response to the differential voltage applied at VN and VP. To form a complete rail-to-rail amplifier, currents I1–I4 are routed to an output stage 21, which operates to produce the amplifier's output voltage $V_{out}$.

The input stage also includes a tail current source circuit 22 which provides a tail current $I_T$ to the input stage transistors. Tail current source circuit 22 is arranged to provide tail current $I_T$ to common mode node 18 when the common mode input voltage $$V_{cm}\left(=\frac{VN+VP}{2}\right)$$

is less than a predetermined reference voltage $V_{ref}$, and to common mode node 20 when $V_{cm} > V_{ref}$.

One possible mechanism for steering $I_T$ to the proper node is shown in FIG. 1. A current source 24 outputs tail current $I_T$ to common mode node 18. A steering transistor $Q_T$ is connected between node 18 and a pair of transistors $Q_{m1}$ and $Q_{m2}$ which form a current mirror that mirrors the current in $Q_T$ to common mode node 20. Reference voltage $V_{ref}$ is applied to $Q_T$'s base. When arranged in this way, when $V_{cm} << V_{ref}$, $Q_T$ is off and all of $I_T$ is provided to common mode node 18. When $V_{cm} >> V_{ref}$, $Q_T$ is on and all of $I_T$ is provided to common mode node 20. However, when $V_{cm} \approx V_{ref}$, $I_T$ is provided to both common mode nodes 18 and 20, with each node getting half of $I_T$ when $V_{cm} = V_{ref}$.

As noted above, when the input stage is heavily degenerated, the transconductance of the input stage when $V_{cm} = V_{ref}$ is about twice as high as it is when $V_{cm} \neq V_{ref}$ and only one input pair is conducting. This gives rise to a gain error when operating in the transition region, which can cause discontinuities and distortion in the output voltages produced by the input stage.

The invention overcomes this problem with the use of a current reduction circuit 26, which is arranged to sense the difference in voltage between common mode nodes 18 and 20, and to reduce the amount of current conducted by the input stage transistors when $V_{cm} \approx V_{ref}$, with the magnitude of the current reduction varying with the sensed voltage. Since a transistor's transconductance varies with the current running it ($g_m = I_c/V_t$ for a bipolar transistor, where $I_c$ is collector current and $V_t$ is the thermal voltage), by reducing the amount of current conducted by Q1–Q4 when $V_{cm} \approx V_{ref}$, the input pairs' respective transconductances are lowered, thereby reducing the gain error which might otherwise occur.

The voltage between the common mode nodes is sensed to provide information about the magnitude of the current being conducted by the input stage transistors. The voltage $V_{18}$ at common mode node 18 is given by:

$$V_{18} = V_{cm} + V_{BE} + (I_T/4)*R_d$$

where $V_{BE}$ is the base-emitter voltage of Q1 or Q2. The voltage $V_{20}$ at common mode node 20 is given by:

$$V_{20} = V_{cm} - V_{BE} - (I_T/4)*R_d$$

where $V_{BE}$ is the base-emitter voltage of Q3 or Q4. The difference voltage between the common mode nodes is given by:

$$V_{18} - V_{20} = 2*V_{BE} + (I_T/2)*R_d$$

$V_{BE}$ varies with collector current for a bipolar transistor, and thus $V_{18} - V_{20}$ is a voltage that varies with the current conducted by the input stage transistors, and can therefore be used to control the operation of current reduction circuit 26.

Current reduction circuit 26 is preferably arranged to reduce the amount of current conducted by the input stage transistors when $V_{cm} = V_{ref}$ such that the input stage transconductance when $V_{cm} = V_{ref}$ is equal to the input stage transconductance when $V_{cm} > V_{ref}$ or $V_{cm} < V_{ref}$ and only one pair is conducting. This effectively eliminates the gain error that would otherwise arise due to the increased transconductance in the transition region.

Current reduction circuit 26 could take the form, for example, of an impedance Z which is connected between common mode nodes 18 and 20. The current through impedance Z varies with the voltage across it, which is the voltage ($V_{18} - V_{20}$) between the common mode nodes. Thus, the current conducted through impedance Z reduces the amount of tail current $I_T$ available to the input stage transistors, and lowers their transconductances accordingly.

Figure 2:
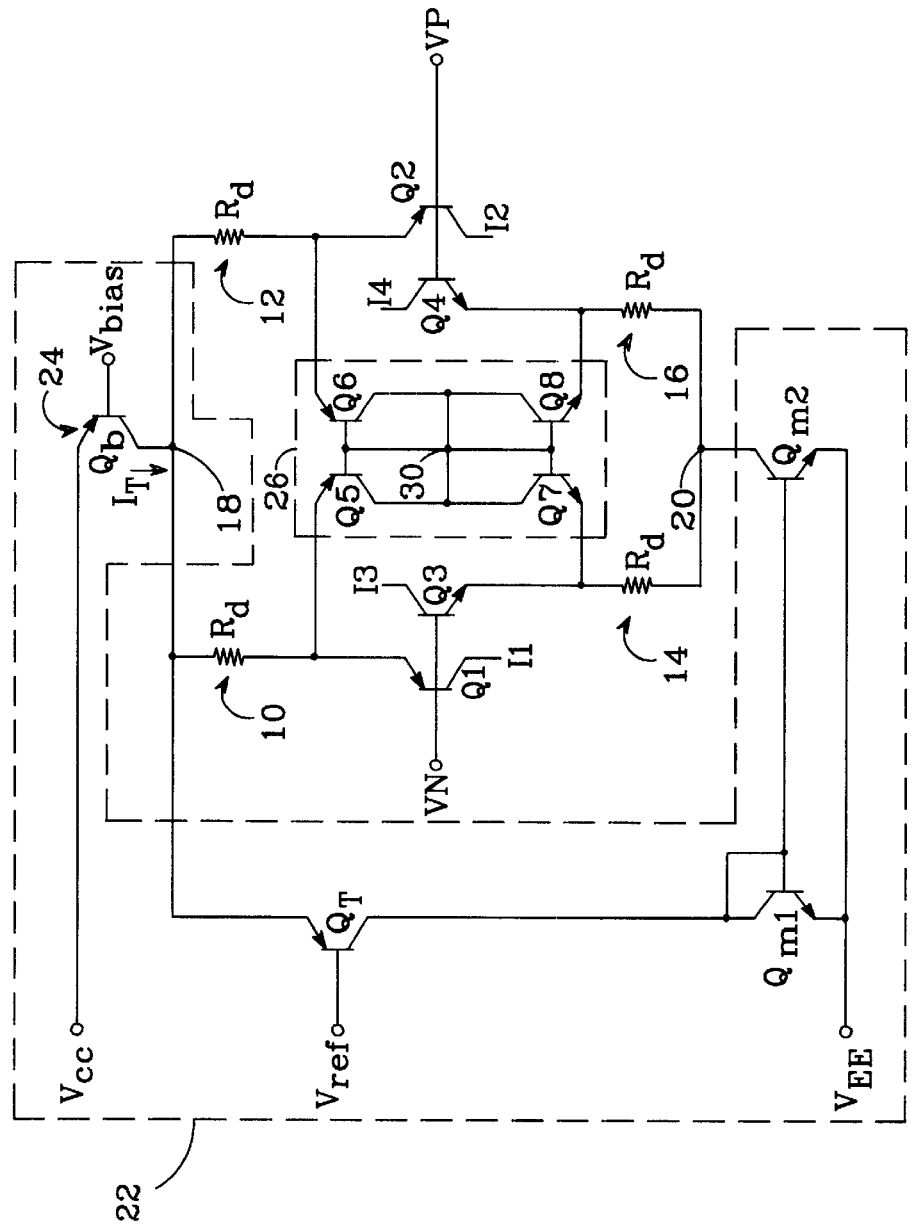
FIG. 2 is a schematic diagram which illustrates the preferred embodiment of the invention.

A preferred embodiment of a rail-to-rail input stage per the present invention is shown in FIG. 2. As before, the input stage includes PNP transistors Q1 and Q2 and NPN transistors Q3 and Q4, each of which has a degeneration resistance $R_d$ in its emitter circuit. A preferred tail current source circuit 22 is shown in FIG. 2, in which current source 24 is implemented with a bias transistor $Q_b$ that produces tail current $I_T$ in response to a bias voltage $V_{bias}$.

Current reduction circuit 26 preferably comprises four transistors: a pair of PNP transistors Q5 and Q6 having their emitters connected to the emitters of input stage transistors Q1 and Q2, respectively, and a pair of NPN transistors Q7 and Q8 having their emitters connected to the emitters of input stage transistors Q3 and Q4, respectively. The collectors and bases of Q5–Q8 are all connected to a common summing node 30.

When so arranged, current reduction circuit 26 operates to sense the difference in voltage between common mode nodes 18 and 20, and to shunt tail current around the input stage transistors when $V_{cm} \approx V_{ref}$; the amount of current which is shunted varies with the sensed voltage. Shunting current around the input stage in this way reduces the amount of tail current conducted by the input stage transistors, thereby lowering the input stage's transconductance as described above.

When $V_{cm} < V_{ref}$, Q1 and Q2 each conduct one-half of tail current $I_T$, and Q3 and Q4 have no current through them. Similarly, when $V_{cm} > V_{ref}$, Q3 and Q4 each conduct $I_T/2$, and Q1 and Q2 conduct no current. However, when $V_{cm} = V_{ref}$, each of the input stage transistors Q1, Q2, Q3 and Q4 carries one-fourth of the tail current ($I_T/4$). This results in the input stage transconductance $G_{m2}$ when $V_{cm} = V_{ref}$ being given by:

$$G_{m2} = \frac{2}{\frac{(kT/q)}{I_T/4} + R_d}$$

To keep gain constant through the transition region, $G_{m2}$ needs to be equal to the transconductance $G_m$ when only one input pair is operating. This is accomplished by properly sizing shunt circuit transistors Q5–Q8. To make $G_m$ and $G_{m2}$ equal requires that:

$$\frac{2}{\frac{(kT/q)}{I_T/4\alpha} + R_d} = \frac{1}{\frac{(kT/q)}{I_T/2} + R_d}$$

where the constant α represents the percentage of the tail current shunted away from the input devices when $V_{cm}=V_{ref}$. Solving for α yields:

$$\alpha = \frac{R_d q I_T}{4kT} + 1 = \frac{R_d g_m}{2} + 1$$

where $g_m$ is the transconductance of an input stage transistor when not in the transition region.

To achieve the desired current reduction, the collector current in each active device must be reduced from $I_c$ to $I_c/\alpha$. If $I_c$ is assumed to be 1, then $1/\alpha$ goes through each input stage transistor, and $1-(1/\alpha)$ goes through each shunt transistor. This requires the ratio Y of the emitter area of an input stage transistor to the emitter area of a shunt transistor to be:

$$Y = \frac{1/\alpha}{1 - 1/\alpha} = \frac{1}{\alpha - 1}$$

Substituting $$\frac{R_d g_m}{2} + 1$$

for α gives:

$$Y = \frac{1}{\frac{R_d g_m}{2}}$$

Thus, if the emitter area of each of input transistor Q1–Q4 is A, the emitter area $A_{sh}$ of each of shunt transistors Q5–Q8 must be:

$$A_{sh} = \frac{R_d g_m}{2} * A$$

When so arranged, current reduction circuit 26 reduces the current in the input stage transistors when $V_{cm}=V_{ref}$ such that $G_{m2}=G_m$, thereby reducing the gain error and distortion that might otherwise be present.

For example, assume that $I_T=40$ μA and the emitter degeneration resistance $R_d$ is 1300Ω. The transconductance $g_m$ of an input transistor when not in the transition region is given by:

$$g_m = \frac{I_T/2}{V_T} = 0.769 \times 10^{-3} \, A/V$$

then $$A_{sh} = \frac{R_d g_m}{2} * A \approx \frac{1}{2} * A$$

Thus, when the emitter area of each input stage transistor Q1–Q4 is A, the emitter area of each shunt transistor Q5–Q8 should be made approximately equal to 0.5*A to make $G_{m2}=G_m$ when $V_{cm}=V_{ref}$.

Current only flows through current reduction circuit 26 when both pairs of input stage transistors are conducting, as both pairs must be on to provide a path for the shunted current. As noted above, the percentage by which the tail current is reduced by circuit 26 is determined by the ratio of the sizes of the shunt transistors to the input stage transistors.

Figure 3:
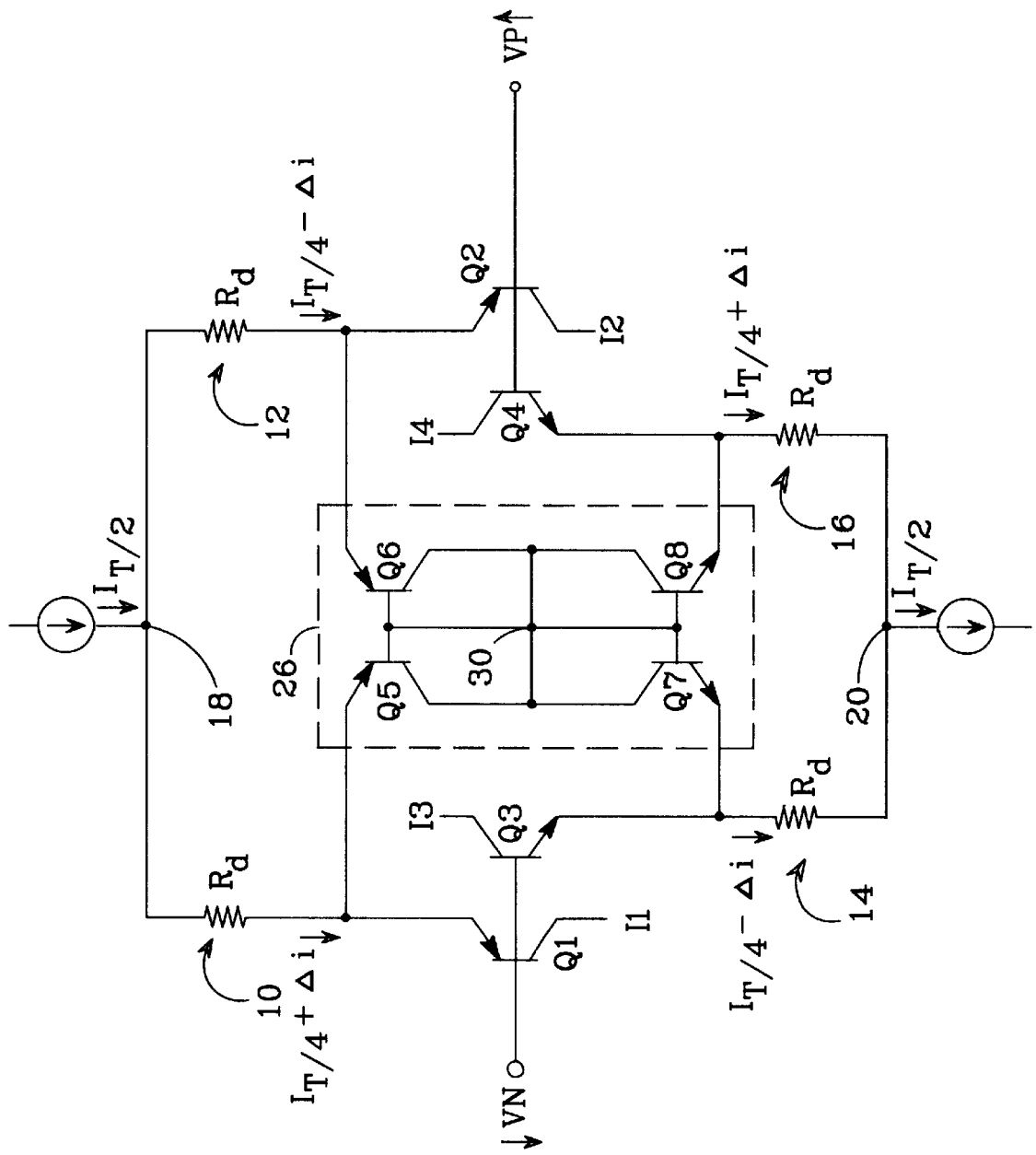
FIG. 3 is a schematic diagram of a portion of a rail-to-rail input stage per the present invention used to illustrate current flow through the circuit.

The current in each of the input stage and shunt transistors when $V_{cm}=V_{ref}$ can be determined in the following manner. FIG. 3 illustrates a portion of the present input stage; the tail current source circuit is not shown for simplicity. When there is a small differential voltage across inputs VN and VP (VP is greater than VN in FIG. 3) and $V_{cm}=V_{ref}$, each input stage transistor carries one-fourth of the tail current, plus or minus a small differential current Δi. Thus, transistors Q1 and Q4 each conduct a current equal to $I_T/4+\Delta i$, and Q2 and Q3 each conduct a current equal to $I_T/4-\Delta i$. Then, assuming that each of transistors Q1–Q4 has an emitter area of 1 and each of shunt transistors Q5–Q8 has an emitter area $A_{sh}=R_d g_m/2$ (as defined above), the current in each transistor can be computed as follows:

$$I_{Q1} = I_{Q4} = \left(\frac{1}{1+A}\right)(I_T/4 + \Delta i)$$

$$I_{Q2} = I_{Q3} = \left(\frac{1}{1+A}\right)(I_T/4 - \Delta i)$$

$$I_{Q5} = I_{Q8} = \left(\frac{A}{1+A}\right)(I_T/4 + \Delta i)$$

$$I_{Q6} = I_{Q7} = \left(\frac{A}{1+A}\right)(I_T/4 - \Delta i)$$

The currents through Q5 and Q6 sum at summing node 30, and leave current reduction circuit 26 through Q7 and QB. As can be seen from the equations above, the currents through Q5 and Q8 are equal, as are the currents through Q6 and Q7. Thus, the application of a differential input voltage as described in FIG. 3 causes current to be shunted around the input stage transistors, with the shunted current flowing from Q6 to Q7 and from Q5 and Q8.

Figure 4A:
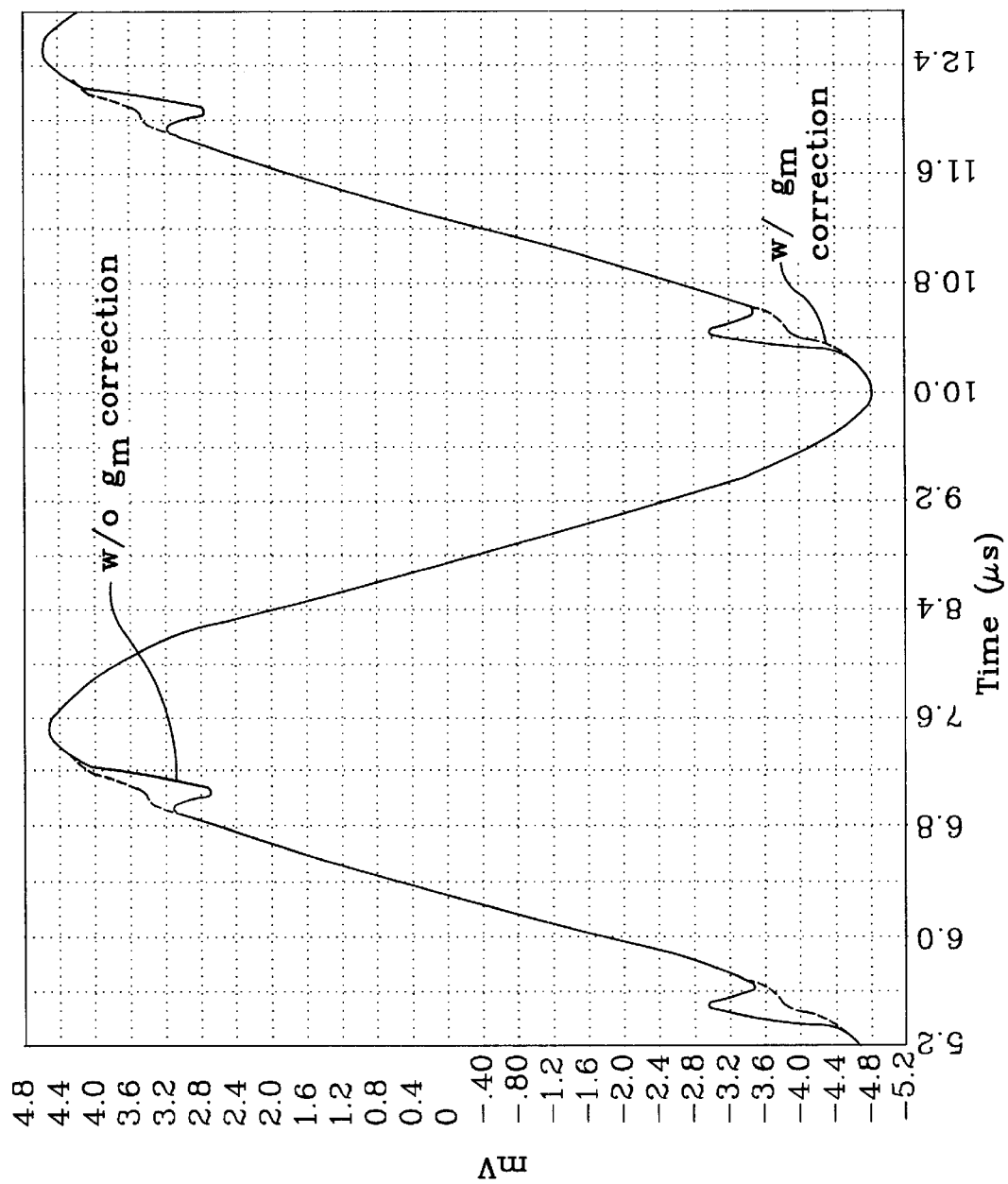
FIG. 4a is a graph of the error voltage produced by an operational amplifier employing a rail-to-rail input stage operating in the transition region with and without transconductance correction per the present invention.

The improvement in amplifier performance achieved with the present invention is seen with reference to the plot shown in FIG. 4a and the table shown in FIG. 4b. The plot shows the error voltage of a sine-wave driven operational amplifier connected in a unity gain configuration and which employs a rail-to-rail input stage that is operating in the transition region, with and without transconductance correction per the present invention. Distortion is clearly reduced when the transconductance correction circuit is employed. This is further seen with reference to the table in FIG. 4b, which lists harmonic distortion values at various frequencies for an operational amplifier employing a rail-to-rail input stage that is operating in the transition region, with and without transconductance correction per the present invention.

Figure 5:
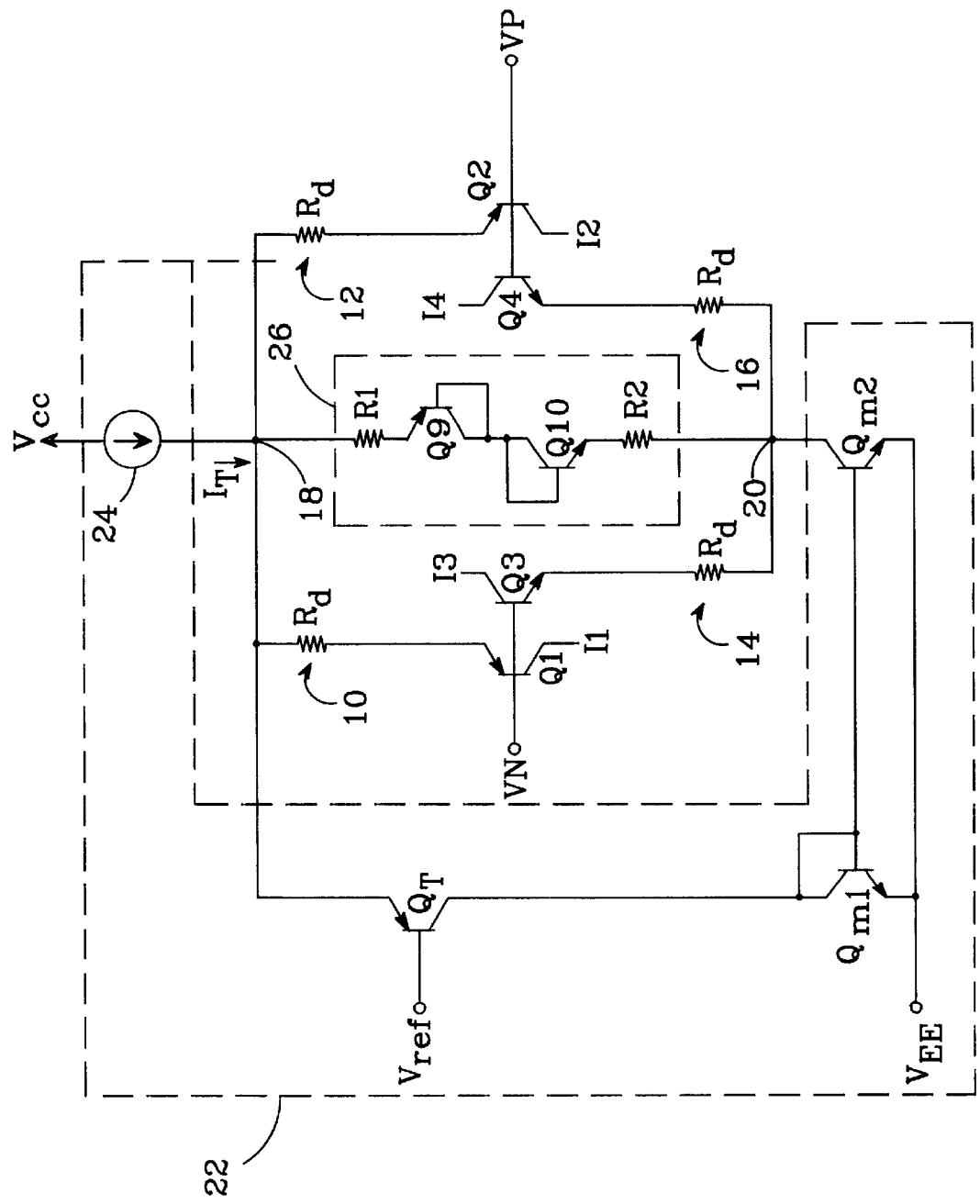
FIG. 5 is a schematic diagram of an alternative current reduction circuit suitable for use with a rail-to-rail input stage per the present invention.

The implementation of current reduction circuit 26 shown in FIG. 2 is preferred, but many other implementations could be used to sense the difference in voltage between the two common mode nodes, and to reduce the amount of current conducted by the input stage transistors when $V_{cm} \approx V_{ref}$, with the magnitude of the current reduction varying with the sensed voltage. One such alternative implementation is shown in FIG. 5. Here, current reduction circuit 26 comprises two resistors R1 and R2, a diode-connected PNP transistor Q9, and a diode-connected NPN transistor Q10, all connected in series between common mode nodes 18 and 20. Alternatively, resistors R1 and R2 could be combined into one resistor. This approach has the disadvantage of employing at least one additional resistor, which makes the solution inaccurate for current splits other than 50/50.

Figure 6:
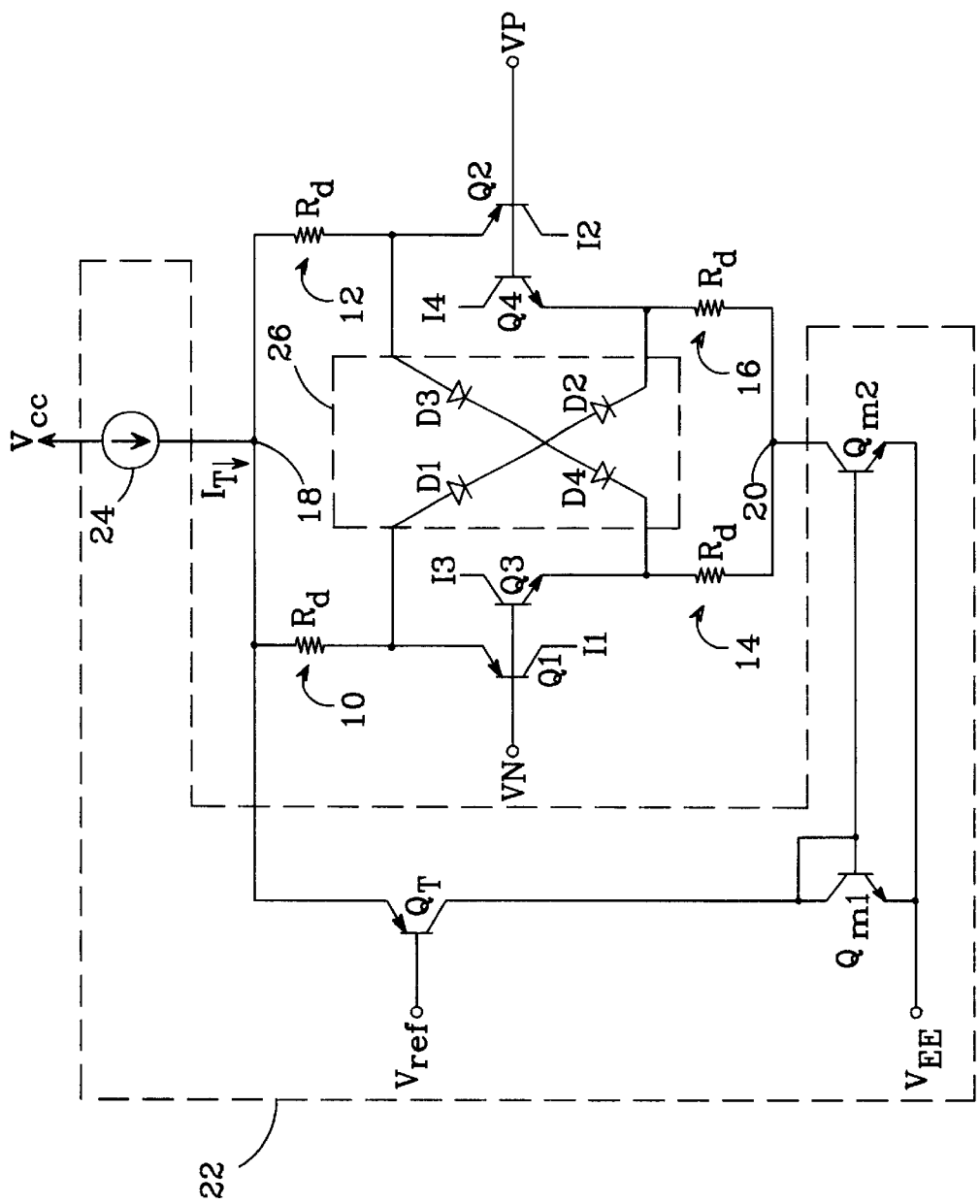
FIG. 6 is a schematic diagram of an alternative current reduction circuit suitable for use with a rail-to-rail input stage per the present invention.

Another exemplary implementation of current reduction circuit 26 is shown in FIG. 6. Here, current reduction circuit 26 comprises four diodes: D1 and D2 connected in series between the emitters of Q1 and Q4, and D3 and D4 connected in series between the emitters of Q2 and Q3. This approach may also perform poorly for tail current splits other than 50/50.

Figure 7:
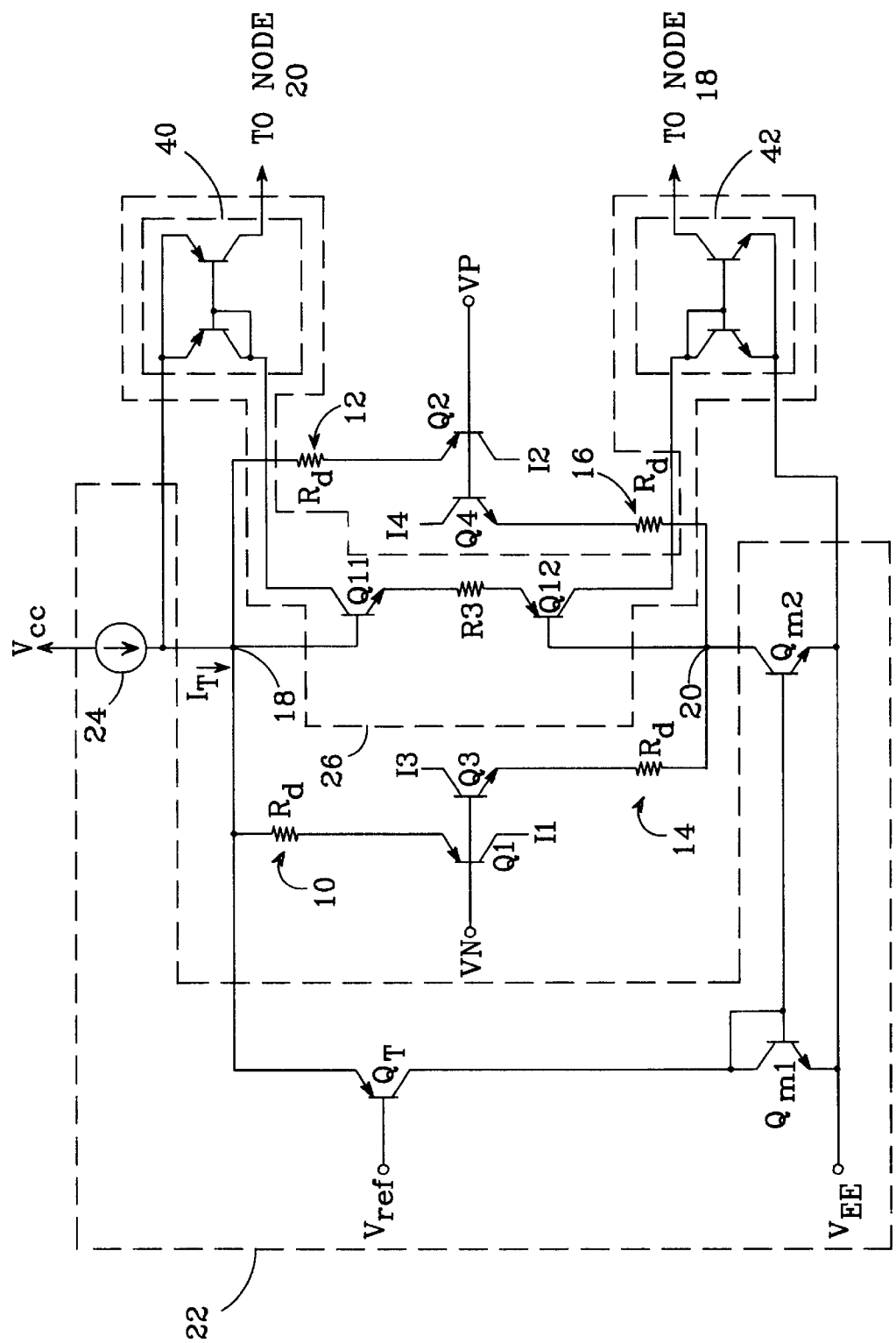
FIG. 7 is a schematic diagram of an alternative current reduction circuit suitable for use with a rail-to-rail input stage per the present invention.

Another alternative embodiment of current reduction circuit 26 is shown in FIG. 7. Here, the base of an NPN transistor Q11, a resistor R3, and the base of a PNP transistor Q12 are connected in series between common mode nodes 18 and 20; the collectors of Q11 and Q12 are connected to respective current mirror subtraction circuits 40 and 42, the outputs of which are connected to common mode nodes 20 and 18, respectively. This circuit senses the difference voltage between nodes 18 and 20, and subtraction circuits 40 and 42 reduce current in the input stage transistors in response. This approach has the disadvantage of employing a resistor, which makes the solution inaccurate for tail current splits other than 50/50.

Figure 8:
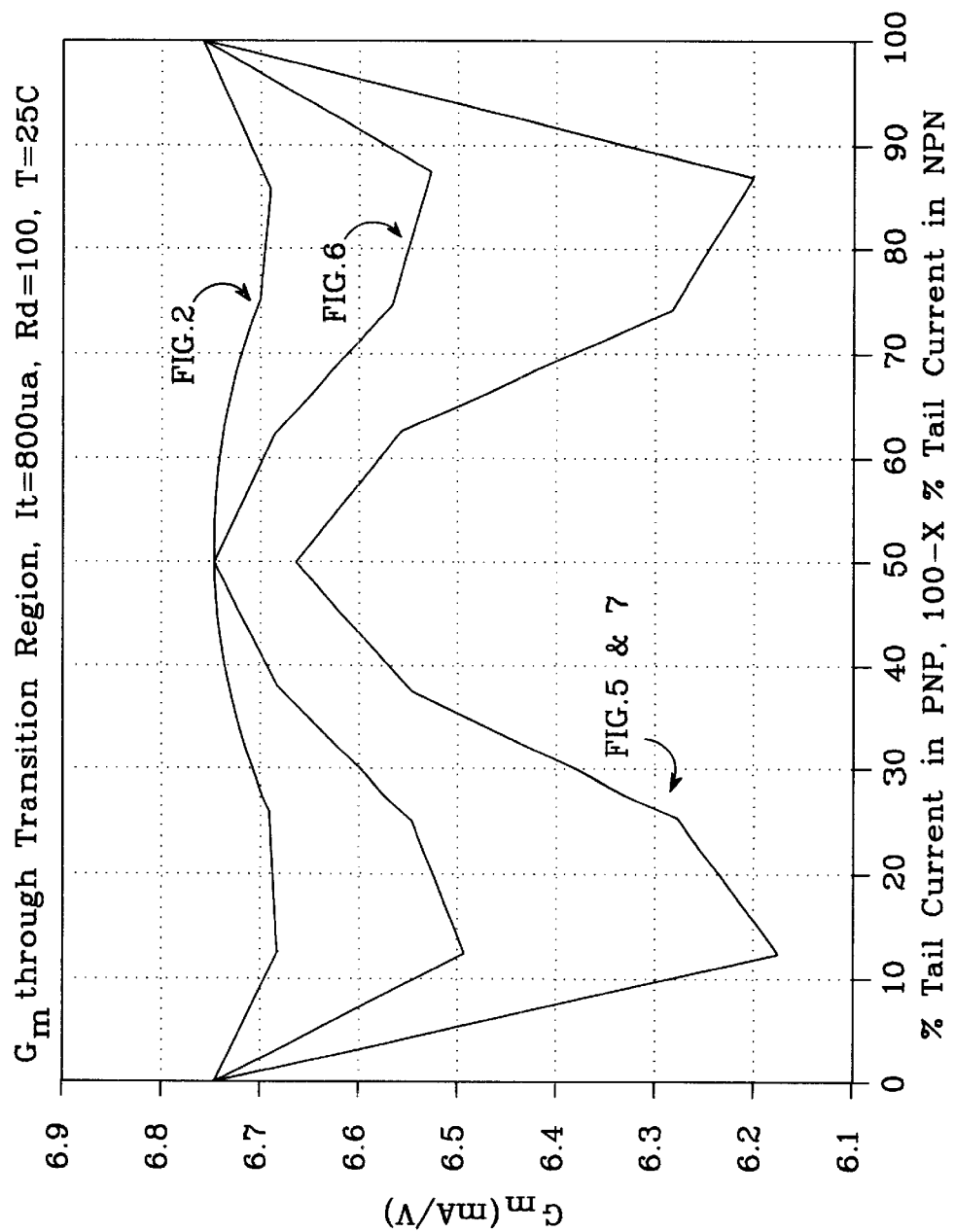
FIG. 8 is a graph depicting input stage transconductance through the transition region for different embodiments of the present invention.

Each of the embodiments described above was simulated, and the transconductance Gm through the transition region calculated. The results are shown in FIG. 8. As is clearly shown, the best performance is provided by the preferred current reduction circuit depicted in FIG. 2.

As noted above, the current reduction circuits 26 shown in FIGS. 1–3 and 5–7 are merely exemplary; many other implementations are possible.

While particular embodiments of the invention have been shown and described, numerous variations and alternate embodiments will occur to those skilled in the art. Accordingly, it is intended that the invention be limited only in terms of the appended claims.

I claim:

1. A bipolar rail-to-rail input stage with transconductance correction, comprising:

a first differential pair comprising first and second PNP transistors having their bases connected to receive a differential input signal and arranged to conduct respective collector currents which vary with said differential input signal, said differential input signal having a common mode voltage $V_{cm}$, a second differential pair comprising first and second NPN transistors having their bases connected to receive said differential input signal and arranged to conduct respective collector currents which vary with said differential input signal, a first emitter degeneration resistor connected between the emitter of said first PNP transistor and a first common mode node, a second emitter degeneration resistor connected between the emitter of said second PNP transistor and said first common mode node, a third emitter degeneration resistor connected between the emitter of said first NPN transistor and a second common mode node, a fourth emitter degeneration resistor connected between the emitter of said second NPN transistor and said second common mode node, a tail current source circuit arranged to provide a tail current $I_T$ to said first common mode node when $V_{cm}$ is less than a reference voltage $V_{ref}$, to provide $I_T$ to said second common mode node when $V_{cm} > V_{ref}$, and to provide tail current $I_T/2$ to each of said first and second common mode nodes when $V_{cm} = V_{ref}$, and a current reduction circuit arranged to sense the difference in voltage between said first and second common mode nodes, and to reduce the amount of tail current which said first and second differential pairs would otherwise conduct to lower said pairs' respective transconductances when $V_{cm} \approx V_{ref}$, the magnitude of said current reduction varying with said sensed voltage.

2. The input stage of claim 1, wherein said current reduction circuit is an impedance connected between said first and second common mode nodes.

3. The input stage of claim 1, wherein said current reduction circuit is arranged to reduce the amount of tail current conducted by said first and second differential pairs when $V_{cm} = V_{ref}$ such that the transconductance of said input stage when $V_{cm} = V_{ref}$ is equal to the transconductance of said input stage when $V_{cm} > V_{ref}$ or $V_{cm} < V_{ref}$ and only one of said first and second differential pairs is conducting.

4. The input stage of claim 1, wherein said tail current source circuit comprises:

a fixed current source having an output connected to said first common mode node and arranged to provide said tail current $I_T$ at said output, a current mirror circuit having an input and an output and arranged to provide a current at its output which varies with a current applied at its input, said current mirror output connected to said second common mode node, and a steering transistor having a current circuit and a control input, said current circuit connected between said first common mode node and said current mirror input and said control input connected to receive said reference voltage $V_{ref}$, said tail current source circuit arranged such that said steering transistor is off when $V_{cm} << V_{ref}$ such that all of tail current $I_T$ is provided to said first common mode node, and is on when $V_{cm} >> V_{ref}$ such that all of tail current $I_T$ is provided to said second common mode node.

5. The input stage of claim 4, wherein said fixed current source comprises a bias transistor having a current circuit and a control input, said current circuit connected between a supply voltage and said first common mode node and said control input connected to receive a bias voltage such that said bias transistor conducts tail current $I_T$ to said first common mode node in response to said bias voltage.

6. The input stage of claim 1, further comprising an output stage connected to receive the collector currents of said first and second differential pairs and to produce an output voltage in response.

7. A bipolar rail-to-rail input amplifier with transconductance correction, comprising:

an input stage, comprising:

a first differential pair comprising first and second PNP transistors having their bases connected to receive a differential input signal and arranged to conduct respective collector currents which vary with said differential input signal, said differential input signal having a common mode voltage $V_{cm}$, a second differential pair comprising first and second NPN transistors having their bases connected to receive said differential input signal and arranged to conduct respective collector currents which vary with said differential input signal, a first emitter degeneration resistor connected between the emitter of said first PNP transistor and a first common mode node, a second emitter degeneration resistor connected between the emitter of said second PNP transistor and said first common mode node, a third emitter degeneration resistor connected between the emitter of said first NPN transistor and a second common mode node, fourth emitter degeneration resistor connected between the emitter of said second NPN transistor and said second common mode node, a tail current source circuit which receives a reference voltage $V_{ref}$ and provides a tail current $I_T$ to said first common mode node when $V_{cm}<V_{ref}$, provides said tail current $I_T$ to said second common mode node when $V_m>V_{ref}$, and provides tail current $I_T/2$ to each of said first and second common mode nodes when $V_{cm}=V_{ref}$, and a current shunt circuit, comprising:
third and fourth PNP transistors, the emitters of which are connected to the emitters of said first and second PNP transistors, respectively, and the bases and collectors of which are connected together at a summing node, third and fourth NPN transistors, the emitters of which are connected to the emitters of said first and second NPN transistors, respectively, and the bases and collectors of which are connected together at said summing node, said current shunt circuit arranged to sense the difference in voltage between said common mode nodes and to shunt current around said first and second differential pairs to reduce the tail current said pairs would otherwise conduct and thereby lower their respective transconductances when $V_{cm} \approx V_{ref}$, the magnitude of said current reduction varying with said sensed voltage, and an output stage connected to receive the collector currents of said first and second differential pairs and to produce an output voltage in response.

8. The amplifier of claim 7, wherein said current shunt circuit is arranged to reduce the amount of tail current conducted by said first and second differential pairs when $V_{cm}=V_{ref}$ such that the transconductance of said input stage when $V_{cm}=V_{ref}$ is equal to the transconductance of said input stage when $V_{cm}>V_{ref}$ or $V_{cm}<V_{ref}$ and only one of said first and second differential pairs is conducting.

9. The amplifier of claim 8, wherein each of said emitter degeneration resistors has a resistance $R_d$, each of said first and second NPN transistors and said first and second PNP transistors has a transconductance $g_m$, given by $$\frac{I_T/2}{V_T},$$

where $V_T$ is the thermal voltage, each of said first and second NPN transistors and said first and second PNP transistors has an emitter area A, and each of said third and fourth NPN and said third and fourth PNP transistors has an emitter area given by $$A * \frac{R_d g_m}{2}.$$

10. The amplifier of claim 7, wherein said tail current source circuit comprises:

a fixed current source having an output connected to said first common mode node and arranged to provide said tail current $I_T$ at said output, a current mirror circuit having an input and an output and arranged to provide a current at its output which varies with a current applied at its input, said current mirror output connected to said second common mode node, and a steering transistor having a current circuit and a control input, said current circuit connected between said first common mode node and said current mirror input and said control input connected to receive said reference voltage $V_{ref}$, said tail current source circuit arranged such that said transistor is off when $V_{cm}<<V_{ref}$ such that all of tail current $I_T$ is provided to said first common mode node, and is on when $V_{cm}>>V_{ref}$ such that all of tail current $I_T$ is provided to said second common mode node.

11. The amplifier of claim 10, wherein said fixed current source comprises a bias transistor having a current circuit and a control input, said current circuit connected between a supply voltage and said first common mode node and said control input connected to receive a bias voltage such that said bias transistor conducts tail current $I_T$ to said first common mode node in response to said bias voltage.

* * * * *